US009941482B2

(12) United States Patent
He et al.

(10) Patent No.: US 9,941,482 B2
(45) Date of Patent: Apr. 10, 2018

(54) ORGANIC ELECTROLUMINESCENT DEVICE, METHOD OF PREPARING SAME, DISPLAY SUBSTRATE, AND DISPLAY APPARATUS

(71) Applicant: BOE TECHNOLOGY GROUP CO., LTD., Beijing (CN)

(72) Inventors: Xiaolong He, Beijing (CN); Zhanfeng Cao, Beijing (CN); Qi Yao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 435 days.

(21) Appl. No.: 14/775,847

(22) PCT Filed: Jan. 13, 2015

(86) PCT No.: PCT/CN2015/070611
§ 371 (c)(1),
(2) Date: Sep. 14, 2015

(87) PCT Pub. No.: WO2016/045258
PCT Pub. Date: Mar. 31, 2016

(65) Prior Publication Data
US 2016/0301024 A1    Oct. 13, 2016

(30) Foreign Application Priority Data
Sep. 25, 2014 (CN) .......................... 2014 1 0498485

(51) Int. Cl.
H01L 51/50 (2006.01)
H01L 51/56 (2006.01)
H01L 51/00 (2006.01)

(52) U.S. Cl.
CPC ........ H01L 51/502 (2013.01); H01L 51/0007 (2013.01); H01L 51/5056 (2013.01);
(Continued)

(58) Field of Classification Search
CPC ............... H01L 51/0061; H01L 51/006; H01L 51/0059; H01L 51/5056; H01L 51/5012;
(Continued)

(56) References Cited

U.S. PATENT DOCUMENTS

2015/0380654 A1* 12/2015 Tang .................... H01L 51/502
257/13

FOREIGN PATENT DOCUMENTS

CN        1743361 A      3/2006
CN        102027384 A    4/2011
(Continued)

OTHER PUBLICATIONS

International Search Report dated Sep. 25, 2014 issued in International Application No. PCT/CN2015/070611 along with an English translation of the Written Opinion.
(Continued)

Primary Examiner — Gregory D Clark
(74) Attorney, Agent, or Firm — Nath, Goldberg & Meyer; Joshua B. Goldberg

(57) ABSTRACT

This invention provides an organic electroluminescent device, a method of preparing the same, a display substrate comprising the same, and a display apparatus. According to the invention, the agglomeration and self quenching of quantum dots can be effectively prevented as the quantum dots are uniformly dispersed in electroluminescent polymer fibers. Due to the fluorescence resonance energy transfer effect between the electroluminescent polymer and the quantum dots, a higher quantum yield is achieved, and the luminescence efficiency of the quantum dots can be improved accordingly. Furthermore, since the light emission from the quantum dots is achieved by the fluorescence resonance energy transfer effect, which is an energy transfer process without damage to the quantum dots, the damage to
(Continued)

quantum dots is less and thus the lifetime thereof can be beneficially increased, as compared to the direct charge injection mode of the prior art.

20 Claims, 2 Drawing Sheets

(52) U.S. Cl.
CPC ...... *H01L 51/5072* (2013.01); *H01L 51/5088* (2013.01); *H01L 51/5092* (2013.01); *H01L 51/5096* (2013.01); *H01L 51/56* (2013.01); *H01L 51/0039* (2013.01); *H01L 2251/558* (2013.01)

(58) Field of Classification Search
CPC ............. H01L 51/0072; H01L 51/0074; H01L 51/0058; H01L 51/0056; C07D 209/86; C07D 333/76; C07C 211/58; C07C 211/61; C07C 211/54; C07C 2603/97; C09K 11/06; C09K 2211/1007; C09K 2211/1014; C09K 2211/1092; C09K 2211/1022

See application file for complete search history.

(56) References Cited

FOREIGN PATENT DOCUMENTS

| | | |
|---|---|---|
| CN | 102483220 A | 5/2012 |
| CN | 103779509 A | 5/2014 |
| WO | 2013157494 A1 | 10/2013 |

OTHER PUBLICATIONS

First Office Action dated Mar. 30, 2016 corresponding to Chinese application No. 201410498485.1.

* cited by examiner

ORGANIC ELECTROLUMINESCENT DEVICE, METHOD OF PREPARING SAME, DISPLAY SUBSTRATE, AND DISPLAY APPARATUS

This is a National Phase Application filed under 35 U.S.C. 371 as a national stage of PCT/CN2015/070611, filed Jan. 13, 2015, an application claiming the benefit of Chinese Application No. 201410498485.1, filed Sep. 25, 2014, the content of each of which is hereby incorporated by reference in its entirety.

FIELD OF THE INVENTION

The present invention relates to the field of manufacturing of display products, and particularly to an organic electroluminescent (OEL) device, a method of preparing the OEL device, a display substrate comprising the OEL device, and a display apparatus comprising the display substrate.

BACKGROUND OF THE INVENTION

Quantum dot light-emitting diode (QD-LED) display is a new display technology developed on the basis of organic light-emitting display (OLED) and differs in the electroluminescent structure comprising a quantum dot layer.

The electroluminescent structure of the existing QD-LED display comprises an anode, a hole injection layer, a hole transport layer, a quantum dot layer, a hole blocking layer, an electron transport layer, an electron injection layer, and a cathode, wherein electrons from the cathode are injected into the quantum dot layer through the electron injection layer, the electron transport layer and the hole blocking layer, while holes from the anode are injected into the quantum dot layer through the hole injection layer and the hole transport layer, such that the electrons and the holes are combined in the quantum dot layer to emit light.

Quantum dot electroluminescence has the advantages of narrow emission peak, high color saturation, wide color gamut, etc., as compared to organic light-emitting diode display devices.

However, there are still some problems in the QD-LED display apparatus of the prior art, including, for example, 1. the occurrence of self quenching, low luminescence efficiency, short life, and other problems caused by the tendency of quantum dots to agglomerate with each other;
2. the occurrence of damages and decreased lifetime caused by ionization of quantum dots, as the excitons generated by the quantum dots in the charge injection mode are prone to Auger recombination; and
3. the occurrence of changes in the physicochemical properties of the quantum dots per se caused by the injection of a large amount of charges (such as oxidation or reduction effect).

SUMMARY OF THE INVENTION

In order to solve the problems of the prior QD-LED display apparatus as described above, the present invention provides an organic electroluminescent (OEL) device, a method of preparing the same, an OEL display substrate, and an OEL display apparatus.

In one aspect, the present invention provides a method of preparing an OEL device, comprising the following steps:

mixing an organic solvent, a charge control agent, an electroluminescent polymer and quantum dots homogeneously to obtain an electrostatic spinning solution; and forming the electrostatic spinning solution into a quantum dot-containing OEL film by an electrostatic spinning process, wherein the quantum dot-containing OEL film is formed from fibers of the electroluminescent polymer dispersed with the quantum dots.

In another aspect, the present invention provides an OEL device, comprising a quantum dot-containing OEL film formed from electroluminescent polymer fibers dispersed with quantum dots, wherein the fibers further comprise a charge control agent. The OEL device can be produced by the method according to the present disclosure.

In yet another aspect, the present invention provides an OEL display substrate, comprising an OEL device according to the present disclosure.

In still another aspect, the present invention provides an OEL display apparatus, comprising an OEL display substrate according to the present disclosure.

DETAILED DESCRIPTION OF CERTAIN EMBODIMENTS

The present invention is now described in more detail by way of certain embodiments with reference to the accompanying figures. The embodiments herein are intended to illustrate the present invention so that a person skilled in the art can get a better understanding of the invention, but the details thereof should not be construed as limiting the invention.

Figure 1:
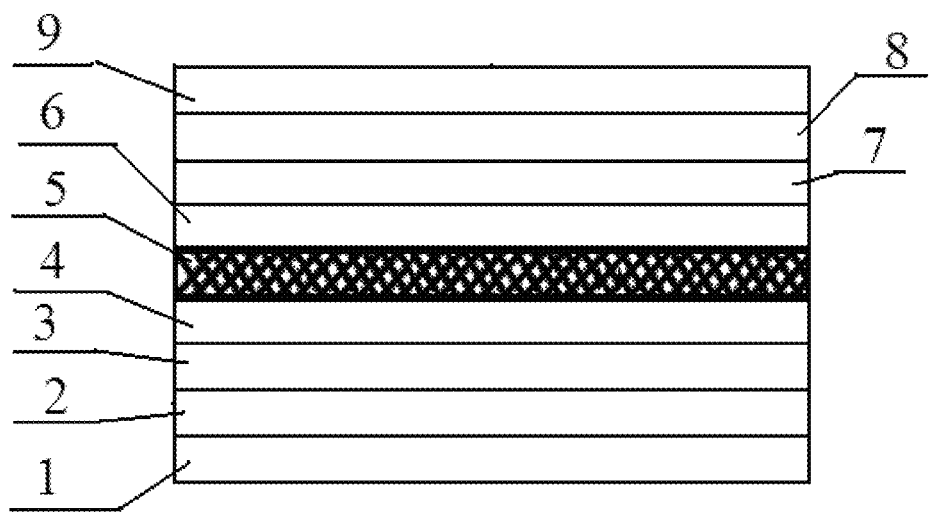
FIG. 1 is a schematic view of the structure of an OEL device of an embodiment of the present invention.
Figure 2:
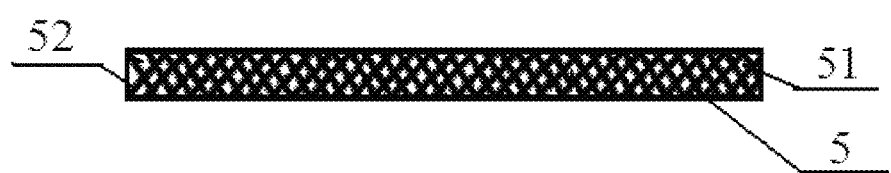
FIG. 2 is a schematic view of the structure of a quantum dot-containing OEL film of an embodiment of the present invention, wherein the quantum dot-containing OEL film is formed from electroluminescent polymer fibers dispersed with quantum dots.

The method of preparing an OEL device according to the present invention comprises the following steps:

mixing an organic solvent, a charge control agent, an electroluminescent polymer and quantum dots homogeneously to obtain an electrostatic spinning solution; and forming the electrostatic spinning solution into a quantum dot-containing OEL film by an electrostatic spinning process, wherein the quantum dot-containing OEL film is formed from fibers of the electroluminescent polymer dispersed with the quantum dots (as shown in FIGS. 1 and 2).

The organic solvent is useful for dissolving the charge control agent and the electroluminescent polymer, and for making the quantum dots uniformly disperse in the electrostatic spinning solution. Preferably, the organic solvent includes one or more organic solvents selected from hydrocarbons and halohydrocarbons, such as acyclic alkanes, cycloalkanes, haloalkanes, aromatic hydrocarbons, and derivatives thereof. Typically, the organic solvent is liquid at room temperature (i.e., 20-30° C.), and the boiling point thereof is less than 200° C., e.g., 180° C., 160° C., 150° C., 140° C., 130° C., 120° C. or less. Generally, the boiling point of the organic solvent is higher than 50° C., e.g., 60° C., 70°

C. or higher. More preferably, the organic solvent includes any one or more of hexane, heptane, octane, cyclohexane, chloroform, toluene, ethylbenzene, and xylene. Herein, hexane, heptane, octane, xylene or the like includes various isomers thereof. For example, hexane includes n-hexane, isohexane, etc.; xylene includes o-xylene, m-xylene, and p-xylene.

The charge control agent is useful for charging the electrostatic spinning solution, and typically is a substance having polar coordinating groups. In the electrostatic spinning process, the molecules of the charge control agent having polar coordinating groups firstly combine with the polymer molecules and ionize in an electric field, thereby the polymer is charged; the polymer is then drawn in the electric field to form electrospun fibers, under the action of both the electric field force and surface tension.

For example, the charge control agent may be a species of amides, and preferably an amide compound soluble in the organic solvent, including, but not limited to, dimethylformamide, dimethylacetamide, propionamide, phenylpropanamide, succinimide, phthalamide, or any combinations thereof.

The electroluminescent polymer is used to form fibers. In the electrostatic spinning process, the electroluminescent polymer can be spun into a fibrous web and can transfer energy to the quantum dots. The electroluminescent polymer includes full-conjugated type, part-conjugated type, and pendant type. Any electroluminescent polymers known in the art, such as those emitting blue light, may be used in the present invention. The electroluminescent polymer includes, but is not limited to, any one or more of polyphenylenes (e.g., ladder-type polyphenylenes), polyindenofluorenes, polyfluorenes, and derivatives thereof. For example, polyfluorene derivatives include copolyfluorenes whose main chains merely consist of fluorene units, and copolyfluorenes whose main chains comprise fluorene units and other units that may be derived from electron-rich comonomers such as aniline, fluorenone, thiophene, etc. The electroluminescent polymer is generally a blue light-emitting electroluminescent polymer.

The quantum dots may be those known in the art. Preferably, the quantum dots comprise any one or more of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, and AlSb. The quantum dots can be those emitting red light (which may have a particle size in the range of 3.8-12 nm), or those emitting green light (which may have a particle size in the range of 2.8-7 nm), or those emitting blue light (which may have a particle size in the range of 2-5 nm).

Preferably, the quantum dots include those having a core-shell structure. The core of such quantum dots may be selected from narrow bandgap quantum dot materials capable of emitting light in the visible spectrum, such as CdSe, CdTe, PbSe, CuInS, CuInSe or the like. The shell of such quantum dots may be selected from wide bandgap quantum dot materials capable of emitting light in the blue and ultraviolet spectrums, such as CdS, ZnO, ZnS, ZnSe, ZnTe or the like. When a core-shell, blue light-emitting quantum dot is desired, at least two species selected from the above-mentioned shell materials may be used, with one (e.g., CdS) as the core and the other(s) (e.g., ZnS) as the shell. The shell may be a single layer or a multilayer. More preferably, the core-shell quantum dots include any one or more of CdSe/CdS, CdS/ZnS, CdSe/ZnS, and CdSe/CdS/ZnS.

It is to be understood that the selection of the electroluminescent polymer should match the selection of the quantum dots, such that the energy of the electroluminescent polymer can be transferred to the quantum dots to enable the emission of colored light of three primary colors by the quantum dots or by the cooperation of the electroluminescent polymer and the quantum dots. As such, the display function can be achieved. The particular matches or combinations of the electroluminescent polymer with the quantum dots and the mass of the quantum dots component can be selected appropriately according to the requirements of specific applications.

It is preferred that the electrostatic spinning solution comprises, by mass %: a charge control agent, 0.1%-10% (e.g., 0.5%, 1%, 2.5%, 4%, 5.5%, 7%, or 8.5%); an electroluminescent polymer, 1%-70% (e.g., 5%, 10%, 15%, 20%, 25%, 30%, 35%, 40%, 45%, 50%, 55%, 60%, or 65%); quantum dots, 0.05%-20% (e.g., 0.1%, 0.25%, 0.5%, 0.75%, 1%, 2.5%, 5%, 7.5%, 10%, 12.5%, 15%, or 17.5%); and the balance being an organic solvent. Preferably, the electrostatic spinning solution comprises, by mass %: a charge control agent, 1%-5% (e.g., 2%, 3%, or 4%); an electroluminescent polymer, 10%-30% (e.g., 15%, 20%, or 25%); quantum dots, 1%-5% (e.g., 2%, 3%, or 4%); and the balance being an organic solvent. Accordingly, in the resultant fibers or films, the mass ratio of quantum dots:electroluminescent polymer:charge control agent is 0.5-200 (e.g., 1, 2.5, 5, 7.5, 10, 25, 50, 75, 100, 125, 150, or 175):10-700 (e.g., 50, 100, 150, 200, 250, 300, 350, 400, 450, 500, 550, 600, or 650):1-100 (e.g., 5, 10, 25, 40, 55, 70, or 85), and preferably (1-5):(10-30):(1-5).

Figure 3:
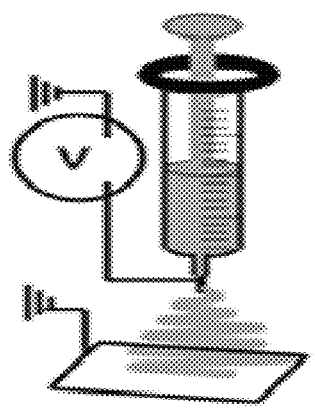
FIG. 3 is a schematic view of an electrostatic spinning process.

The electrostatic spinning process can be performed using any equipment and operation known in the art. For example, FIG. 3 is a schematic view of an electrostatic spinning process, comprising: feeding an electrostatic spinning solution into a syringe equipped with a needle, wherein the needle is made from an electrically conductive material (such as steel, iron, copper, aluminum, etc.); connecting the positive electrode of a direct current (DC) power supply to the needle via a leading wire; and connecting the negative electrode of the power supply to an electrically conductive metal plate. Due to gravity, the electrostatic spinning solution forms a droplet at the tip of the needle. When a DC voltage is applied, the droplet is positively charged and is drawn, under the action of the electric field, to form a nanofiber as the specific surface area thereof is increased sharply and the solvent evaporates rapidly. Consequently, a fibrous web (i.e., a quantum dot-containing OEL film) is formed on the surface of the metal plate. In the electrostatic spinning process, one or more needles may be used, depending on the practical requirements.

The electrostatic spinning process may be performed under the following conditions: electrospinning voltage, 0.5-50 KV; syringe diameter, 0.5-5 mm; the injection rate of the electrostatic spinning solution from the syringe, 0.1-10 mL/h; the gap between the two electrodes forming an electrostatic field, 5-40 cm. preferably, the electrostatic spinning process is performed under the following conditions: electrospinning voltage, 15-40 kV; syringe diameter, 3-5 mm; the injection rate of the electrostatic spinning solution from the syringe, 0.2-2.0 mL/h; the gap between the two electrodes forming an electrostatic field, 10-30 cm.

The present invention further provides an OEL device, comprising a quantum dot-containing OEL film formed from electroluminescent polymer fibers dispersed with quantum dots, wherein the fibers further comprise a charge control agent. The OEL device can be produced by the method according to the present disclosure.

According to the present invention, the quantum dots and the charge control agent are uniformly dispersed in the electroluminescent polymer fibers. At least a part of the charge control agent is adsorbed on the surface of the quantum dots. Since the quantum dot-containing OEL film is a non-woven web formed by the electroluminescent polymer fibers, the quantum dots are also uniformly dispersed in the quantum dot-containing OEL film.

The diameter of the electroluminescent polymer fibers is usually of nanoscale, typically in the range of 10 nm-500 nm, e.g., 20 nm, 50 nm, 80 nm, 100 nm, 130 nm, 150 nm, 180 nm, 300 nm or 500 nm, preferably 10-200 nm, more preferably 10-80 nm, and most preferably 10-50 nm.

The average distance between adjacent quantum dots in the quantum dot-containing OEL film may be 0.5 to 30 times the average particle size of the quantum dots, for example, 27 times, 24 times, 21 times, 18 times, 15 times, 12 times, 8 times, 5 times or 2 times the average particle size of the quantum dots. Preferably, the average distance between adjacent quantum dots in the quantum dot-containing OEL film is 1 to 20 times, and more preferably 1 to 10 times, the average particle size of the quantum dots. The OEL device comprises the quantum dot-containing OEL film.

The thickness of the quantum dot-containing OEL film is preferably in the range of 10-500 nm, e.g., 50, 100, 150, 200, 250, 300, 350, 400 or 450 nm; more preferably 20-80 nm, e.g., 30, 40, 50, 60 or 70 nm.

The quantum dot-containing OEL film may be formed by a single layer or multiple layers of electroluminescent polymer fibers, with the single layer being preferred.

The OEL device may further comprise, on one side of the quantum dot-containing OEL film: a hole transport layer, a hole injection layer, and an anode, which are disposed sequentially in the direction away from the film; and comprise, on the other side of the quantum dot-containing OEL film: a hole blocking layer, an electron transport layer, an electron injection layer, and a cathode, which are disposed sequentially in the direction away from the film.

FIG. 1 schematically illustrates an OEL device of an embodiment of the present invention. The OEL device comprises: a glass substrate 1; an anode 2; a hole injection layer 3; a hole transport layer 4; a quantum dot-containing OEL film 5; a hole blocking layer 6; an electron transport layer 7; an electron injection layer 8; and a cathode 9.

FIG. 2 schematically illustrates the quantum dot-containing OEL film 5 formed from fibers of electroluminescent polymer 52 dispersed with quantum dots 51, wherein the fibers further comprise a uniformly dispersed charge control agent (not shown).

The present invention also provides an OEL display substrate comprising the OEL device.

The present invention also provides an OEL display apparatus comprising the OEL display substrate.

The present invention produces advantageous effects including: the agglomeration and self quenching of quantum dots can be effectively prevented as the quantum dots are uniformly dispersed in the electroluminescent polymer fibers according to the invention; a relatively high quantum yield can be achieved by the fluorescence resonance energy transfer effect between the electroluminescent polymer and the quantum dots, and the luminescence efficiency of the quantum dots can be improved. Moreover, since the light emission from quantum dots is achieved by the fluorescence resonance energy transfer effect (which is an energy transfer process without damage to the quantum dots), the damage to quantum dots per se is less and thus the lifetime thereof is beneficially increased, as compared to the direct charge injection mode of the prior art.

The features or elements of the respective aspects and embodiments of the present invention described herein can be combined with each other. Unless indicated otherwise, all the numbers expressing the sizes of elements, quantities of ingredients and measurement of properties used herein are to be understood as being modified in all instances by the term "about". Accordingly, unless indicated to the contrary, the numerical parameters set forth in the specification and attached claims are approximations that can vary depending upon the desired properties sought to be obtained by those skilled in the art utilizing the teachings of the present invention. In addition, unless indicated otherwise, the recitation of numerical ranges by endpoints includes the endpoints, as well as all subsets and numbers subsumed within that range (e.g., 1%-5% includes 1%, 3%, 5%, 2-4%, etc.). As used herein, the term "and/or" means any one, or more, or even all of the options listed can be chosen.

The present invention will be explained in further detail with reference to the preferred embodiments.

In one embodiment, OEL devices as shown in FIG. 1 were provided. The OEL devices were respectively produced by a process comprising the following steps.

1. Preparation of an Anode, a Hole Injection Layer, and a Hole Transport Layer

On a glass substrate 1, an anode 2, a hole injection layer 3 and a hole transport layer 4 were prepared according to a process of the prior art. For more details of the process, see Colvin V L, Schlamp M C, and Alivisatos A P, Light-emitting diodes made from cadmium selenide nanocrystals and nanocrystals and a semiconducting polymer, Nature, 1994, 370(4): 354-357.

2. Preparation of an Electrostatic Spinning Solution

An organic solvent, a charge control agent, an electroluminescent polymer and quantum dots were mixed homogeneously to form an electrostatic spinning solution.

Specifically, various electrostatic spinning solutions were formulated according to the compositions shown in Table 2. The respective charge control agents, electroluminescent polymers and quantum dots were added, in the specified amounts (mass %), to the respective organic solvents and stirred at 200-400 rpm for 2-4 hours to obtain the respective electrostatic spinning solutions.

The organic solvent includes any one or more of n-hexane, cyclohexane and chloroform. It should be understood that the organic solvent may include other hydrocarbons or halohydrocarbons.

The charge control agent includes dimethylformamide and dimethylacetamide. It should be understood that the charge control agent may include other amides for charging the solution such that the electrostatic spinning process can be performed.

The electroluminescent polymer includes any one or more of polyphenylenes, ladder-type polyphenylenes, polyindenofluorenes, polyfluorenes, and derivatives thereof.

The quantum dots 51 include any one or more of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, and AlSb. It should be understood that the quantum dots 51 may be those emitting red light (which may have a particle size in the range of 3.8-12 nm), or those emitting green light (which may have a particle size in the range of 2.8-7 nm), or those emitting blue light (which may have a particle size in the range of 2-5 nm).

In particular, the quantum dots 51 may have a core-shell structure. Specifically, the core-shell quantum dots 51 include any one or more of CdSe/CdS, CdS/ZnS, CdSe/ZnS, and CdSe/CdS/ZnS.

3. Implementation of Electrostatic Spinning

By an electrostatic spinning process, the resultant electrostatic spinning solution was applied to the aforesaid hole transport layer 4 to form a quantum dot-containing OEL film 5, wherein the film 5 is formed from electroluminescent polymer fibers dispersed with quantum dots 51. It should be noted that the electrostatic spinning process and equipment are known in the art, for example, as described by Doshi, J. and Reneker, D. H. (1995), "Electrospinning process and applications of electrospun fibers", Journal of Electrostatics 35 (2-3): 151.

Specifically, the electrostatic spinning process was performed under the following conditions: electrospinning voltage, 0.5-50 KV; syringe diameter, 0.5-5 mm; the injection rate of the electrostatic spinning solution from the syringe, 0.1-10 mL/h; the gap between the two electrodes forming an electrostatic field, 5-40 cm. It has been shown by measurement that, in the quantum dot-containing OEL film 5 obtained under such conditions, the average distance between adjacent quantum dots 51 is 0.5 to 30 times, preferably 1 to 20 times, and more preferably 1 to 10 times the average particle size of the quantum dots 51.

4. Preparation of a Hole Blocking Layer, an Electron Transport Layer, an Electron Injection Layer, and a Cathode On the quantum dot-containing OEL film 5, a hole blocking layer 6, an electron transport layer 7, an electron injection layer 8 and a cathode 9 were prepared sequentially according to a process of the prior art. For more details of the process, see Jinxin CHEN, Xiaowen HUANG, OLED Dream Displays—Materials and Devices, Posts & Telecom Press, June 2011, 1$^{st}$ Edition.

Various quantum dot-containing OEL films and the corresponding OEL devices (as shown in FIG. 1) were prepared in the same manner as described above, except for the compositions and process conditions listed hereinafter.

The resultant quantum dot-containing OEL films and the OEL devices were measured and tested by the following procedures.

1. Thickness of a Quantum Dot-Containing OEL Film

The thickness of a quantum dot-containing OEL film was measured by a scanning electron microscope (SEM). Specifically, a fibrous film produced by the electrostatic spinning was cut into a specimen for SEM measurement and was sputtered with gold. Then, the film section of the specimen was observed to measure the film thickness, using an SEM apparatus S-4300 (Hitachi Co., Ltd.) equipped with a cold field emission gun. The SEM measurement was conducted under the following conditions: accelerating voltage, 0.5-30 KV; resolution, 1.5 nm (15 KV), 5 nm (1 KV). The thicknesses of the quantum dot-containing OEL films prepared in the examples of the present invention were measured to be in the range of 10-500 nm.

2. Average Distance Between Adjacent Quantum Dots in the Quantum Dot-Containing OEL Film The average distance between adjacent quantum dots in the quantum dot-containing OEL film was measured by a transmission electron microscope (TEM). Specifically, electrospun fibers produced by the electrostatic spinning were transferred to the surface of a copper grid (TEM specimen mount), and then placed in a TEM apparatus JEM-2100 (JEOL Co., Ltd.) to measure the average distance between adjacent quantum dots. The TEM measurement was conducted under the following conditions: accelerating voltage, 200 KV; high resolution pole piece; specimen tilt angle, X axis: ±25°, Y axis: ±36°; point resolution, 0.23 nm. The average distances between adjacent quantum dots in the quantum dot-containing OEL films prepared in the examples of the present invention were measured to be in the range of 0.5-30 times the diameter of the quantum dots per se.

3. Fluorescence Intensity, Luminescence Efficiency, and Lifetime

A substrate to be tested was placed in the sample holder of an IVL test apparatus DY 001828 (Kunshan New Flat Panel Display Technology Center Co., Ltd.), and a voltage of 3V was applied to light it up, followed by adjusting the focal length to make the light emitting area of the device clear. The fluorescence intensity and luminescence efficiency were measured with the following settings: voltage, 0-6V; step, 0.25V. The test apparatus was operated under the following conditions:

Detection range, 380 nm-780 nm; detection interval, ±2 nm;

Minimum test area, 0.12 mm (aperture size ⅛°);

Various aperture sizes from ⅛° to 2° available;

SpectraWin 2 test software;

Test temperature, 5-30° C., humidity, 0-90% RH.

The apparatus can be used to test the characteristic parameters of OLED devices, such as I-V-L, driving voltage, etc. (the fluorescence intensity, luminescence efficiency and the like can be obtained in the same test process upon automated processing by the software).

After a voltage was applied, a curve was obtained for the luminance of quantum dots as a function of time. The time for 50% decay of the maximum luminance as extrapolated from the luminance-time curve was reported as the lifetime.

The quantum dot-containing OEL films prepared in the examples of the present invention were measured to have a fluorescence intensity up to: red light of 8000 cd/m$^2$, green light of 100000 cd/m$^2$, or blue light of 1000 cd/m$^2$; a luminescence efficiency up to 15-23%; and a lifetime up to 10000 h ($T_{50}$, i.e., the time for 50% decay in luminance).

The materials and the equipment used in the examples are described in Table 1 below.

TABLE 1

| Materials/Equipment | Name | Description |
| --- | --- | --- |
| Organic solvent | n-Hexane | Sigma-aldrich, Product No. 296090 |
|  | Chloroform | Sigma-aldrich, Product No. C7559 |
| Charge control agent | Dimethylformamide | Sigma-aldrich, Product No. PHR1553 |
| Electroluminescent polymer | Polyfluorene | Sigma-aldrich, Product No. 555002 |

TABLE 1-continued

| Materials/Equipment | Name | Description |
|---|---|---|
| Quantum dots (QDs) | Blue light (B) quantum dots: CdS (core)/ZnS (shell), Average particle size: 4.2 nm | Sigma-aldrich, Product No. 753866 |
| | Green light (G) quantum dots: CdSe (core)/ZnS (shell), Average particle size: 5.8 nm | Sigma-aldrich, Product No. 694622 |
| | Red light (R) quantum dots: CdSe (core)/ZnS (shell), Average particle size: 7.2 nm | Sigma-aldrich, Product No. 694622 |
| Spinning equipment | DC Power Supply | Agilent, N8900 series high-power DC Power Supply |

The compositions (expressed in mass %) of the electrostatic spinning solutions used in Examples 1-6 and Comparative Example 1 are shown in Table 2. The abbreviation "QDs" refers to the amount of quantum dots; more particularly, for the case of R (red light), G (green light) or B (blue light), it refers to the amount of the quantum dots emitting light of the corresponding color as listed in Table 1.

The compositions and thicknesses of the other layers are as follows: ITO anode, 150 nm; PEDOT hole injection layer, 30 nm; TFB hole-transporting layer, 20 nm; BCP hole blocking layer, 10 nm; PBD electron transport layer, 20 nm; electron injection layer and cathode of metal Al, 100 nm.

The operation parameters of the electrostatic spinning process are as follows: voltage, 1 KV; spinning time, 5 min; syringe diameter, 1.5 mm; injection rate, 1 mL/h; the gap between electrodes, 15 cm.

TABLE 2

| Example No. | Composition of electrostatic spinning solution |
|---|---|
| Example 1 | Polyfluorene, 15%; QDs, 0.1%; dimethylformamide, 0.2%; chloroform/n-hexane 1:6 (by volume), balance |
| Example 2 | Polyfluorene, 15%; QDs, 2%; dimethylformamide, 0.2%; chloroform/n-hexane 1:6 (by volume), balance |
| Example 3 | Polyfluorene, 15%; QDs, 10%; dimethylformamide, 0.2%; chloroform/n-hexane 1:6 (by volume), balance |
| Example 4 | Polyfluorene, 5%; QDs, 2%; dimethylformamide, 0.2%; chloroform/n-hexane, 1:6 (by volume), balance |
| Example 5 | Polyfluorene, 30%; QDs, 2%; dimethylformamide, 0.2%; chloroform/n-hexane 1:6 (by volume), balance |
| Example 6 | Polyfluorene, 60%; QDs, 2%; dimethylformamide, 0.2%; chloroform/n-hexane 1:6 (by volume), balance |
| Comparative Example 1 (free of quantum dots) | Polyfluorene, 15%; dimethylformamide, 0.2%; chloroform/n-hexane 1:6 (by volume), balance |

In Comparative Example 2, no electroluminescent polymer was introduced, but only quantum dots were used. Thus, spin coating was conducted, instead of spinning. The coated film in dry state was 30 nm.

The examples and comparative examples were tested according to the procedures described hereinbefore, and the results are reported in Table 3 below.

TABLE 3

| Example No. | Thickness of quantum dot-containing-OEL film | Average distance between adjacent quantum dots in quantum dot-containing-OEL film | Fluorescence intensity | Luminescence efficiency | Lifetime |
|---|---|---|---|---|---|
| Example 1 | 40 nm | 20 nm | R: 6000 cd/m$^2$<br>G: 40000 cd/m$^2$<br>B: 100 cd/m$^2$ | R 17%<br>G 10%<br>B 4% | 8000 h |
| Example 2 | 60 nm | 15 nm | R: 8000 cd/m$^2$<br>G: 100000 cd/m$^2$<br>B: 1000 cd/m$^2$ | R 23%<br>G 18%<br>B 10% | 10000 h |
| Example 3 | 80 nm | 5 nm | R: 1000 cd/m$^2$<br>G: 10000 cd/m$^2$<br>B: 60 cd/m$^2$ | R 14%<br>G 7%<br>B 2% | 8600 h |
| Example 4 | 20 nm | 10 nm | R: 4000 cd/m$^2$<br>G: 60000 cd/m$^2$<br>B: 700 cd/m$^2$ | R 14%<br>G 6%<br>B 3% | 8000 h |
| Example 5 | 60 nm | 40 nm | R: 7000 cd/m$^2$<br>G: 80000 cd/m$^2$<br>B: 320 cd/m$^2$ | R 8%<br>G 4%<br>B 2.5% | 9600 h |
| Example 6 | 100 nm | 120 nm | R: 1000 cd/m$^2$<br>G: 5000 cd/m$^2$<br>B: 140 cd/m$^2$ | R 6%<br>G 3.7%<br>B 2.2% | 8800 h |
| Comparative Example 1 | 30 nm | Not applicable | B: 500 cd/m$^2$ | B 1.8% | 15000 h |
| Comparative Example 2 | Spin coating, 30 nm | Unmeasured | R: 3200 cd/m$^2$<br>G: 20000 cd/m$^2$<br>B: 300 cd/m$^2$ | R 10%<br>G 6.8%<br>B 3.5% | 1000 h |

As can be seen from Table 3, in the process of preparing the OEL devices of the examples according to the present invention, organic solvents were evaporated rapidly by the electrostatic spinning technique such that the quantum dots were uniformly dispersed in the fibers, thereby the agglomeration and self quenching of quantum dots 51 were effectively prevented, and the fluorescence intensity of quantum dots per unit of mass was greatly enhanced. Moreover, since the quantum dots were protected by the fibers from the moisture and oxygen in the environment, the lifetime thereof was also prolonged significantly. By the fluorescence resonance energy transfer effect between the electroluminescent polymer and the quantum dots 51, a higher quantum yield was achieved, and the luminescence efficiency of the quantum dots 51 per unit of mass was effectively improved accordingly. Furthermore, since the light emission from the quantum dots 51 was achieved by the fluorescence resonance energy transfer effect (an energy transfer process without damage to the quantum dots 51), the damage to quantum dots 51 was less and thus the lifetime thereof was beneficially increased, as compared to the direct charge injection mode of the prior art.

Figure 4:
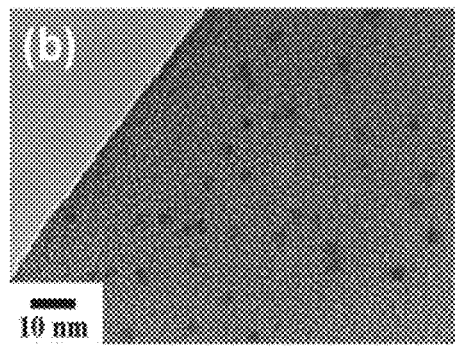
FIG. 4 shows a transmission electron microscope (TEM) photograph of the OEL film of Example 2.

The OEL devices provided by the examples of the present invention respectively comprise a quantum dot-containing OEL film 5 for emitting light. As shown in FIG. 2, the quantum dot-containing OEL film 5 comprises the organic electroluminescent polymer 52 forming a fibrous web. The quantum dots 51 are uniformly dispersed in the quantum dot-containing OEL film 5, as shown in FIG. 4 (the TEM photographs of the other examples are similar to FIG. 4).

It also can be seen from Table 3 that, in the OEL devices of the examples according to the present invention, the agglomeration and self quenching of quantum dots 51 were effectively prevented as the quantum dots 51 were uniformly dispersed in the fibers of the electroluminescent polymer. Due to the fluorescence resonance energy transfer effect between the electroluminescent polymer and the quantum dots 51, a higher quantum yield was achieved, and the luminescence efficiency of the quantum dots 51 per unit of mass was effectively improved accordingly. Furthermore, since the light emission from the quantum dots 51 was achieved by the fluorescence resonance energy transfer effect (an energy transfer process without damage to the quantum dots 51), the damage to quantum dots 51 was less and thus the lifetime thereof was beneficially increased, as compared to the direct charge injection mode of the prior art.

Preferably, in the OEL film 5 dispersed with quantum dots 51, the average distance between adjacent quantum dots is 1 to 10 times the average particle size of the quantum dots 51. As such, the effects as described above can be further improved.

In another embodiment, OEL display substrates respectively comprising the OEL devices of the above examples were prepared.

In still another embodiment, OEL display apparatuses respectively comprising the OEL display substrates of the above embodiment were prepared.

It has been demonstrated that, in the OEL devices of the present invention, the agglomeration and self quenching of quantum dots 51 can be effectively prevented as the quantum dots 51 are uniformly dispersed in the fibers of the electroluminescent polymer. Due to the fluorescence resonance energy transfer effect between the electroluminescent polymer and the quantum dots 51, a higher quantum yield is achieved, and the luminescence efficiency of the quantum dots 51 per unit of mass can be improved accordingly. Furthermore, since the light emission from the quantum dots 51 is achieved by the fluorescence resonance energy transfer effect (an energy transfer process without damage to the quantum dots 51), the damage to quantum dots 51 is less and thus the lifetime thereof can be beneficially increased, as compared to the direct charge injection mode of the prior art. Therefore, the performances of the OEL display substrates and display apparatuses of the present invention are improved accordingly.

It should be understood that the above embodiments of the invention have been disclosed only for illustrating the principle of the present invention, but they are not intended to limit the present invention. The person skilled in the art can make various modifications and variations of the invention without departing from the spirit and scope of the invention, thus the modifications and variations of the invention are included within the scope of the present invention.

The invention claimed is:

1. A method of preparing an organic electroluminescent device, comprising the following steps:
   mixing an organic solvent, a charge control agent, an electroluminescent polymer and quantum dots homogeneously to obtain an electrostatic spinning solution; and
   forming the electrostatic spinning solution into a quantum dot-containing organic electroluminescent film by an electrostatic spinning process, wherein the quantum dot-containing organic electroluminescent film is formed from fibers of the electroluminescent polymer dispersed with the quantum dots.

2. The method of preparing an organic electroluminescent device according to claim 1, characterized in that,
   (a) the organic solvent includes one or more selected from acyclic alkanes, cycloalkanes, haloalkanes, aromatic hydrocarbons, and derivatives thereof, wherein the organic solvent is liquid at room temperature and has a boiling point lower than 200° C.;
   (b) the charge control agent includes any one or more of dimethylformamide, dimethylacetamide, propionamide, phenylpropanamide, succinimide, and phthalamide;
   (c) the electroluminescent polymer includes any one or more of polyphenylenes, polyindenofluorenes, polyfluorenes, and derivatives thereof; and/or
   (d) the quantum dots include any one or more of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, and AlSb.

3. The method of preparing an organic electroluminescent device according to claim 2, characterized in that, the organic solvent includes any one or more of hexane, heptane, octane, cyclohexane, chloroform, toluene, ethylbenzene, and xylene.

4. The method of preparing an organic electroluminescent device according to claim 2, characterized in that, the electroluminescent polymer is selected from ladder-type polyphenylenes, polyphenylenes, polyindenofluorenes, polyfluorenes, copolyfluorenes whose main chains merely consist of fluorene units, and copolyfluorenes whose main chains comprise fluorene units and other units, wherein the other units are derived from aniline, fluorenone, thiophene, or any combinations thereof.

5. The method of preparing an organic electroluminescent device according to claim 2, characterized in that, the quantum dots are quantum dots having a core-shell structure.

6. The method of preparing an organic electroluminescent device according to claim 5, characterized in that, the quantum dots having a core-shell structure respectively comprise a core composed of a material selected from CdS, CdSe, CdTe, PbSe, CuInS and CuInSe, and one or more shells respectively composed of a material selected from CdS, ZnO, ZnS, ZnSe and ZnTe.

7. The method of preparing an organic electroluminescent device according to claim 6, characterized in that, the quantum dots having a core-shell structure are selected from any one or more of CdSe/CdS, CdS/ZnS, CdSe/ZnS, and CdSe/CdS/ZnS.

8. The method of preparing an organic electroluminescent device according to claim 1, characterized in that, the electrostatic spinning solution comprises, by mass %: the charge control agent, 0.1%-10%; the electroluminescent polymer, 1%-70%; the quantum dots, 0.05%-20%; and the balance being the organic solvent.

9. The method of preparing an organic electroluminescent device according to claim 1, characterized in that, the electrostatic spinning process is performed under the following conditions: electrospinning voltage, 0.5-50 KV; syringe diameter, 0.5-5 mm; injection rate of the electrostatic spinning solution from the syringe, 0.1-10 mL/h; and the gap between two electrodes forming an electrostatic field, 5-40 cm.

10. An organic electroluminescent device, comprising a quantum dot-containing organic electroluminescent film formed from fibers of electroluminescent polymer dispersed with quantum dots, wherein the fibers further comprise a charge control agent.

11. The organic electroluminescent device according to claim 10, characterized in that, the average distance between adjacent quantum dots in the quantum dot-containing organic electroluminescent film ranges from 0.5 to 30 times the average particle size of the quantum dots.

12. The organic electroluminescent device according to claim 10, further comprising, on one side of the quantum dot-containing organic electroluminescent film: a hole transport layer, a hole injection layer, and an anode, which are disposed sequentially in a direction away from the film; and comprising, on the other side of the quantum dot-containing organic electroluminescent film: a hole blocking layer, an electron transport layer, an electron injection layer, and a cathode, which are disposed sequentially in a direction away from the film.

13. The organic electroluminescent device according to claim 10, characterized in that, the quantum dot-containing organic electroluminescent film has a thickness in the range of 10 nm-500 nm.

14. The organic electroluminescent device according to claim 10, characterized in that,
   (a) the quantum dots include any one or more of CdS, CdSe, CdTe, ZnO, ZnS, ZnSe, ZnTe, GaAs, GaP, GaSb, HgS, HgSe, HgTe, InAs, InP, InSb, AlAs, AlP, CuInS, CuInSe, and AlSb;
   (b) the electroluminescent polymer includes any one or more of polyphenylenes, polyindenofluorenes, polyfluorenes, and derivatives thereof
   (c) the charge control agent is selected from dimethylformamide, dimethylacetamide, propionamide, phenylpropanamide, succinimide, phthalamide, or any combinations thereof; and/or
   (d) the mass ratio of quantum dots:electroluminescent polymer:charge control agent is (0.5-200):(10-700):(1-100).

15. The organic electroluminescent device according to claim 14, characterized in that, the electroluminescent polymer is selected from ladder-type polyphenylenes, polyphenylenes, polyindenofluorenes, polyfluorenes, copolyfluorenes whose main chains merely consist of fluorene units, and copolyfluorenes whose main chains comprise fluorene units and other units, wherein the other units are derived from aniline, fluorenone, thiophene, or any combinations thereof.

16. The organic electroluminescent device according to claim 14, characterized in that, the quantum dots are quantum dots having a core-shell structure.

17. The organic electroluminescent device according to claim 16, characterized in that, the quantum dots having a core-shell structure respectively comprise a core composed of a material selected from CdS, CdSe, CdTe, PbSe, CuInS and CuInSe, and one or more shells respectively composed of a material selected from CdS, ZnO, ZnS, ZnSe and ZnTe.

18. The organic electroluminescent device according to claim 17, characterized in that, the quantum dots having a core-shell structure are selected from any one or more of CdSe/CdS, CdS/ZnS, CdSe/ZnS, and CdSe/CdS/ZnS.

19. An organic electroluminescent display substrate, comprising an organic electroluminescent device according to claim 10.

20. An organic electroluminescent display apparatus, comprising an organic electroluminescent display substrate according to claim 19.

* * * * *